(12) United States Patent
Takebayashi

(10) Patent No.: US 8,513,862 B2
(45) Date of Patent: Aug. 20, 2013

(54) SURFACE ACOUSTIC WAVE DEVICE WITH REDUCED SIZE AND THICKNESS

(75) Inventor: Yuichi Takebayashi, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/452,334

(22) Filed: Apr. 20, 2012

(65) Prior Publication Data

US 2012/0206871 A1 Aug. 16, 2012

Related U.S. Application Data

(63) Continuation of application No. 11/878,539, filed on Jul. 25, 2007, now Pat. No. 8,191,228, which is a continuation of application No. 11/354,182, filed on Feb. 15, 2006, now Pat. No. 7,436,105.

(30) Foreign Application Priority Data

Mar. 3, 2005 (JP) ................................. 2005-058616

(51) Int. Cl.
*H01L 41/04* (2006.01)

(52) U.S. Cl.
USPC .......................................................... 310/344

(58) Field of Classification Search
USPC ......................................... 310/340, 344, 348
See application file for complete search history.

(56) References Cited

U.S. PATENT DOCUMENTS

| | | | |
|---|---|---|---|
| 4,471,259 A | 9/1984 | Stoermer et al. | |
| 5,250,870 A | 10/1993 | Fenlon et al. | |
| 5,821,673 A | 10/1998 | Pisarevsky et al. | |
| 5,949,294 A | 9/1999 | Kondo et al. | |
| 6,229,249 B1 | 5/2001 | Hatanaka et al. | |
| 6,456,168 B1 * | 9/2002 | Luff | 331/68 |
| 6,734,605 B2 * | 5/2004 | Kinoshita | 310/348 |
| 7,157,836 B2 | 1/2007 | Kinoshita | |
| 7,259,501 B2 * | 8/2007 | Usuda | 310/344 |
| 7,436,105 B2 * | 10/2008 | Takebayashi | 310/348 |
| 7,521,843 B2 * | 4/2009 | Naruse | 310/344 |
| 8,093,785 B2 * | 1/2012 | Wada | 310/340 |
| 8,155,366 B2 * | 4/2012 | Baumhauer et al. | 381/369 |
| 2002/0084858 A1 | 7/2002 | Luff | |
| 2004/0245891 A1 | 12/2004 | Kawachi et al. | |
| 2005/0151240 A1 * | 7/2005 | Takeda et al. | 257/700 |

FOREIGN PATENT DOCUMENTS

| | | |
|---|---|---|
| JP | A-05-291864 | 11/1993 |
| JP | A-9-83248 | 3/1997 |
| JP | A-09-098025 | 4/1997 |
| JP | 10-150273 | 6/1998 |
| JP | A-2000-323927 | 11/2000 |
| JP | 2001-102870 | 4/2001 |
| JP | 2006-13681 | 1/2006 |

\* cited by examiner

*Primary Examiner* — Jaydi San Martin
(74) *Attorney, Agent, or Firm* — Oliff & Berridge, PLC

(57) ABSTRACT

A package structure realizing a size and/or thickness reduction and suitable for packaging a surface acoustic wave element is provided. The package structure for solving the above challenge includes a base having a thick floor on which to place a surface acoustic wave element and a thin floor on which to place an electronic component, the surface acoustic wave element and the electronic component being mounted close to each other on the plane coordinate system. In addition, in the package structure described above, the difference in height between the thin floor and the thick floor is the same as, or larger than, the thickness of the electronic component mounted on the thin floor.

4 Claims, 4 Drawing Sheets

SURFACE ACOUSTIC WAVE DEVICE WITH REDUCED SIZE AND THICKNESS

CROSS-REFERENCE TO RELATED APPLICATION

This is a Continuation of U.S. application Ser. No. 11/878,539 filed on Jul. 25, 2007, which is a Continuation of U.S. patent application Ser. No. 11/354,182 filed Feb. 15, 2006. The entire disclosures of the prior applications are hereby incorporated by reference herein in their entirety. This application also claims priority from Japanese Patent Application No. 2005-58616, filed in the Japanese Patent Office on Mar. 3, 2005, the entire disclosure of which is hereby incorporated by reference.

TECHNICAL FIELD

The present invention relates to a package structure for a surface acoustic wave device and a surface acoustic wave device, and more particularly to a package structure for a surface acoustic wave device and a surface acoustic wave device that are suitable for reduction of a packaged surface.

BACKGROUND

There are strong demands for reduction of the size and/or the thickness of piezoelectric devices used in information-communication equipments and other equipments. The developing side has responded to such demands through development of various sorts of piezoelectric devices that are intended for reduction of the size and/or the thickness.

Basically, a piezoelectric device is composed of a piezoelectric resonator element, an electronic component such as an integrated circuit (IC) that performs temperature compensation, resonance control and/or other operations for the piezoelectric resonator element, and a package in which the piezoelectric resonator element and the IC are packaged.

As shown in FIGS. 3A and 3B, a common structure of a piezoelectric device that is intended for a reduction of the size includes an IC 3 placed on the floor of a package 4 that is formed in tiers and a piezoelectric resonator element 2 placed on a tier over the IC 3. In such a structure, however, it is necessary to provide a resonating space for the piezoelectric resonator element 2, while also providing a clearance between wires 5 for wire-bonding to package the IC 3 and the piezoelectric resonator element 2. This causes a major problem in reducing the thickness of a piezoelectric device 1 having the structure described above.

On the other hand, among piezoelectric devices that are intended for reduction of the thickness is one disclosed in Patent Document 1. As shown in FIGS. 4A and 4B, in the piezoelectric device disclosed in the document, supporting portions (protrusions in Patent Document 1) 6 are formed inside the package 4 to serve as supporting portions for the piezoelectric resonator element 2, and the piezoelectric resonator element 2 is placed side by side with the IC 3. Such a structure of a piezoelectric device allows a height-lowering of the device by precluding the necessity to allow for a vertical clearance between the piezoelectric resonator element 2 and the IC 3.

The piezoelectric device disclosed in Patent Document 1 is inferior in size reduction, but superior in thickness reduction, to the one shown in FIGS. 3A and 3B. Furthermore, since the piezoelectric resonator element and the IC can be mounted simultaneously or serially in the package, the process of hardening the adhesive used for mounting the two components can be performed at a time as one common process, an advantage that allows an improvement in the productivity. In addition, packaged conditions of the two components can be checked by observing from the surface, even after they have been mounted.

[Patent Document 1] JP-A-H9-83248

Both the piezoelectric device shown in FIGS. 3A and 3B and the one disclosed in Patent Document 1 may be very effective in reducing the size and/or the thickness of the device when an AT cut or other quartz crystal resonator element is employed as a piezoelectric resonator element.

However, generally speaking, the piezoelectric device in FIGS. 3A and 3B and in Patent Document 1 are not suitable for use in cases in which a surface acoustic wave element (SAW element) is employed as a resonator element, a SAW element being thicker and heavier than an AT cut or other quartz crystal resonator element. Both of the piezoelectric devices shown in FIGS. 3A, 3B, 4A and 4B have small supporting areas for a resonator element. Therefore, when a weighty SAW element is mounted, the resonator element undergoes the risk of being deformed by its own weight. It may also be possible to draw upon the piezoelectric device shown in FIGS. 4A and 4B as a guide and provide adequate supporting areas for the resonator element by placing the element and the IC on the same level. However, this tends to deform the package itself because the package floor of the piezoelectric device shown in FIGS. 4A and 4B is thin. Thus, the SAW element supported by the package floor is likely to be affected by deformation of the package.

An object of the invention is to provide a package structure for a surface acoustic wave device and a surface acoustic wave device that realize a reduction in the size and/or the thickness and that is suitable for packaging a surface acoustic wave element.

DISCLOSURE OF THE INVENTION

A package structure for a surface acoustic wave device according to the invention, which is intended for achieving the above object, is the structure of a package that is packaged with a surface acoustic wave element and an electronic component, the package structure having a base that includes a thick floor on which the surface acoustic wave element is placed and a thin floor on which the electronic component is placed, and the surface acoustic wave element and the electronic component being mounted close to each other on the plane coordinate system. In other words, a package structure is provided for a surface acoustic wave device that includes a surface acoustic wave element and an electronic component. The package structure includes a base defining first and second areas, the surface acoustic wave element being disposed at the first area and the electronic component being disposed at the second area. The first and second areas are adjacent relative to a first plane. The base has a greater thickness at least a portion of the first area than at the second area relative to a second plane that is perpendicular to the first plane.

Through such a structure, a sufficient area can be provided for mounting (bonding) the surface acoustic wave element. At the same time, the package is prevented from being easily deformed as well as conveying a deformation that occurs in it, because the floor on which the surface acoustic wave element is placed is thick. The structure also allows packaging (wire-bonding) to be performed after all the components have been die-attached, because the surface acoustic wave element and the electronic component do not vertically overlap each other. Moreover, since the wire-bonding process can be performed after all the components have been mounted, the adhesive has been hardened through heating and annealing has been performed, it is no more necessary to allow for a eutectic to occur between bonding wires and bonding pads, thus allowing annealing to be performed at an adequately high temperature. Furthermore, packaging of the components on two levels, on a thick floor and a thin floor, prevents a collet as a jig from touching adjacent components. Therefore, clearance between components in the mounting area can be reduced, thus realizing a size reduction of the device.

It is preferable that the difference in height between the thin floor and the thick floor is the same as, or larger than, the thickness of the electronic component mounted on the thin floor. Such a structure allows part of the surface acoustic wave element to overlap the electronic component. In other words, a difference in thickness of the base between the at least a portion of the first area and the second area in the second plane is the same as, or larger than, a thickness of the electronic component in the second plane.

A surface acoustic wave device according to the invention, which is intended for achieving the above object, includes a surface acoustic wave element and an electronic component that are packaged inside its package, the device having a base that includes a thick floor and a thin floor, the surface acoustic wave element and the electronic component being placed close to each other on the plane coordinate system, the surface acoustic wave element being mounted on the thick floor and the electronic component being mounted on the thin floor. In other words, a surface acoustic wave device is provided that includes a surface acoustic wave element; an electronic component; and a package for packaging the surface acoustic wave element and the electronic component. The package includes a base defining first and second areas. The surface acoustic wave element is disposed at the first area the electronic component is disposed at the second area. The first and second areas are adjacent relative to a first plane. The base has a greater thickness at least a portion of the first area than at a second area relative to a second plane that is perpendicular to the first plane.

Such a structure allows the surface acoustic wave element to be mounted in a stable manner while preventing the package from being easily deformed or conveying a deformation that occurs in it, because the floor that is mounted with the surface acoustic wave element is thick. The structure also allows packaging (wire-bonding) to be performed after all the components have been die-attached, because the surface acoustic wave element and the electronic component do not vertically overlap each other. In addition, since the wire-bonding process can be performed after all the components have been mounted, the adhesive has been hardened through heating and annealing has been performed, it is no more necessary to allow for a eutectic occurring between bonding wires and bonding pads, and, thus, annealing can be performed at an adequately high temperature. Furthermore, as the components can be packaged on two levels, on a thick floor and a thin floor respectively, a collet used as a jig for mounting the components is prevented from touching adjacent components. Therefore, clearance between components in the mounting area can be reduced, thus realizing a size reduction of the device.

In a surface acoustic wave device described above, it is preferable that the difference in height made between the thin floor and the thick floor is the same as, or larger than, the thickness of the electronic component mounted on the thin floor. Such a structure allows part of the surface acoustic wave element to overlap the electronic component. In other words, a difference in thickness of the base between the at least a portion of the first area and the second area in the second plane is the same as, or larger than, a thickness of the electronic component in the second plane.

It is also preferable that the surface acoustic wave element and the electronic component are mounted in positions such that the surface acoustic wave element does not vertically overlap the electronic component. Through an adjacent placement of the surface acoustic wave element and the electronic component based on the above condition, a further reduction in size will be realized in addition to the advantageous effects described above.

PREFERRED EMBODIMENTS IMPLEMENTING THE INVENTION

A package structure for a surface acoustic wave device and a surface acoustic wave device according to the invention will now be described with reference to the drawings, wherein the embodiment described below only partly represents the embodiments according to the invention.

Figure 1A:
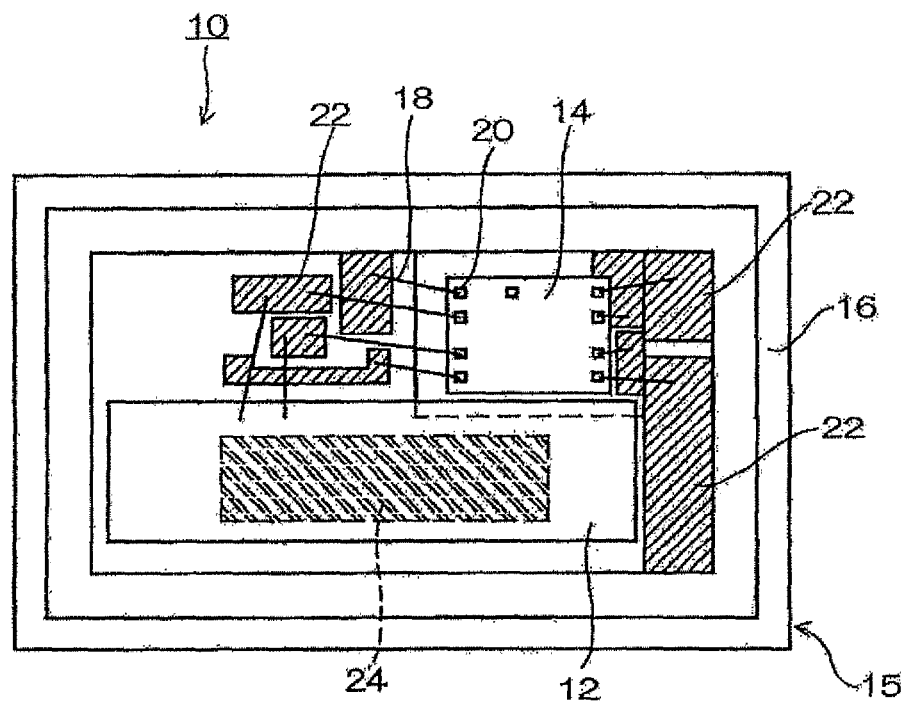
FIGS. 1A and 1B are diagrams showing the structure of a surface acoustic wave device according to the invention.
Figure 1B:
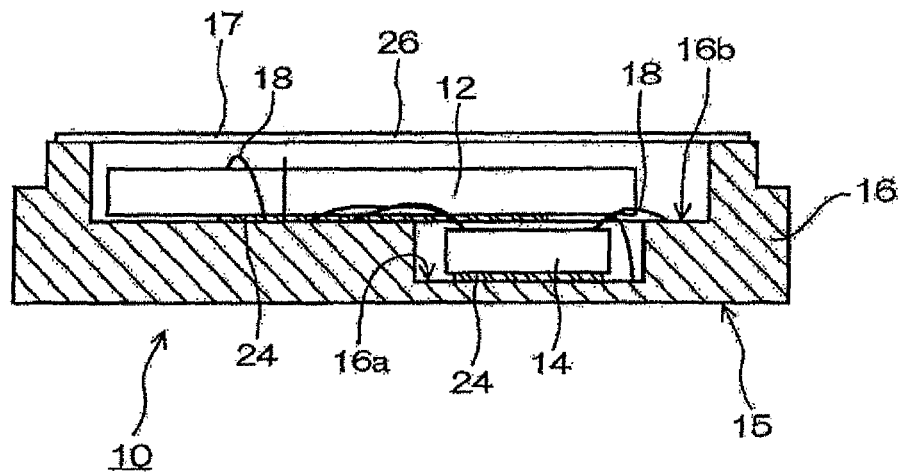

FIGS. 1A and 1B are diagrams showing a piezoelectric device according to the embodiment, wherein FIG. 1A is a plan view and FIG. 1B is a front-sectional view.

A surface acoustic wave device 10 according to the embodiment basically includes a surface acoustic wave element (SAW) 12, an electronic component 14 and a package 15 in which the SAW element 12 and the electronic component 14 are packaged.

As shown by the front-sectional view in FIG. 1B, the package 15 is composed of a base 16 on which packaged components are mounted and a lid 17 to seal the opening of the base 16.

The base 16 includes a thin floor 16a and a thick floor 16b that serve as surfaces on which to mount the packaged components. According to the invention, particularly, the thin floor 16a serves as a surface on which to mount the electronic component 14 and the thick floor 16b serves as a surface on which to mount the SAW element 12. Advantageous effects obtained with such a structure of the package 15 include the ones described below.

First, through a vertical difference made between the surfaces on which the electronic component 14 and the SAW element 12 are respectively mounted (placed), interference between the components can be avoided at the time when they are mounted. Therefore, a narrower clearance can be realized between the components than in the case where they are placed side by side on a plain floor. Thus, consideration is only necessary for a clearance between a jig (collet) for mounting the components and the frame of the base 16.

Second, through use of the thick floor 16b to serve as a surface on which to mount the SAW element 12, rigidity increases in the package (base 16) 15, thereby making it difficult for the surface to be deformed. Moreover, since a sufficient area to match the size of the SAW element is provided for mounting the element, even the heavy SAW element is free from being deformed by its own weight.

Also, when the base 16 packaged with both the electronic component 14 and the SAW element 12 is observed from the top surface (See FIG. 1A), the packaging terminals (bonding pads) of both the electronic component 14 and the SAW element 12 can be checked. Therefore, it is allowed as a manufacturing process to simultaneously perform heating on the electronic component 14 and the SAW element 12 after they have been mounted (bonded), so as to harden adhesive 24 and perform annealing. Furthermore, packaging can be accomplished by simultaneously performing wire-bonding after finishing the processes of hardening the adhesives and annealing.

In addition, as described above, there is no risk that a eutectic occurs between the bonding wires 18 and the bonding pads 20 through a high temperature, because wire-bonding can be performed after the processes of hardening the adhesive 24 and annealing.

It is demonstrated through the applicant's experiments that a eutectic occurs in 30 minutes at the terminal area between the gold wires for wire-bonding and the aluminum bonding pads when the area is heated at a temperature within the range of 260° C. to 270° C. On the other hand, the surface acoustic wave device is heated at about 270° C. for 3 to 4 hours for hardening of the adhesive 24 and annealing. Thus, there is the risk that the eutectic occurring between the wires and the pads progresses and creates a serious defect for finished products. However, such a defect can be avoided for a SAW device 10 having the package 15 of the above structure.

Furthermore, a difference in height is made between the mounted surfaces of the SAW element 12 (thick floor 16b) and the electronic component 14 (thin floor 16a) so as to be the same as, or larger than, the thickness of the mounted electronic component. Therefore, part of the SAW element 12 can be placed so that it overlaps the electronic component 14. In this case, too, a similar effect as above can be achieved if the bonding pads 20 of the electronic component 14 can be identified by observing the base 16 from the top surface after it has been mounted with the components. In this way, the packaging area can be reduced for each component and a more compact surface acoustic wave device 10 can be realized.

The SAW element 12 described above is made of a piezoelectric material such as quartz crystal, Lithium Tantalate or Lithium Niobate, on which metal patterns are made to provide an interdigital transducer (IDT), a reflector, and so on.

The electronic component 14 refers to an integrated circuit (IC) for controlling the oscillation of the SAW element 12, but mounting also a condenser, and/or the like, (not illustrated) besides the IC does not constitute any deviation from the present embodiment.

Figure 2A:
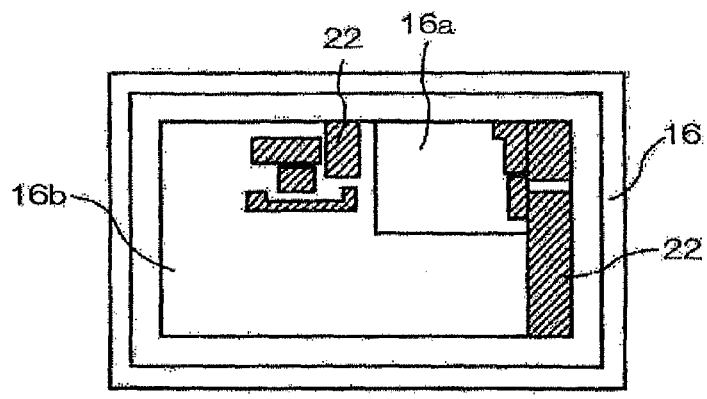
FIGS. 2A, 2B and 2C are diagrams showing the manufacturing stream for the surface acoustic wave device according to the invention.
Figure 2B:
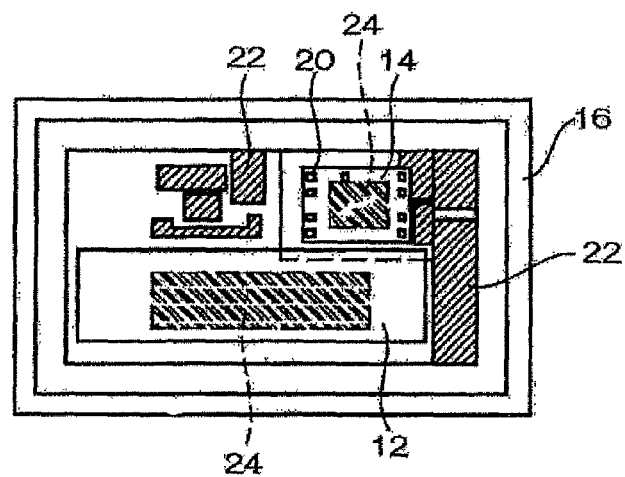

A SAW device 10 according to the embodiment, which includes the above components, is manufactured by a process illustrated in FIG. 2.

First, a base 16 of a package 15 is formed by sintering, or another method of the sort. Commonly, the base 16 is made by depositing and then sintering multiple substrates, but it may also be formed by another method. It is preferable that internal patterns 22 are provided inside the base 16 at the stage of formation (See FIG. 2A).

Next, adhesive 24 is applied to a thin floor 16a of the package, onto which an IC 14, being held by suction by means of a collet, is bonded. Then, the adhesive 24 is applied to a thick floor 16b, onto which an SAW element 12, being held by suction by means of a collet, is bonded. When the SAW element 12 is bonded, the package size can be reduced if the SAW element and packaging terminals (bonding pads) 20 of the IC 14 are placed close to one another to the extent that they do not overlap. After the IC 14 and the SAW element 12 have been bonded to the base 16, they are heated together with the base 16 so that the adhesive 24 is hardened and annealing is performed on the SAW element 12 (See FIG. 2B).

Figure 2C:
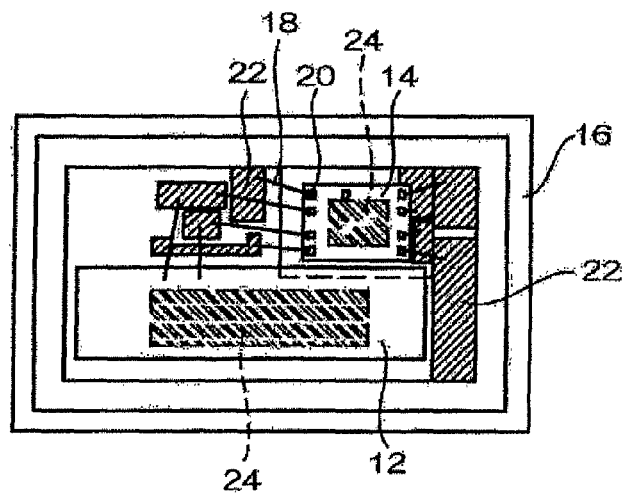
Figure 3A:
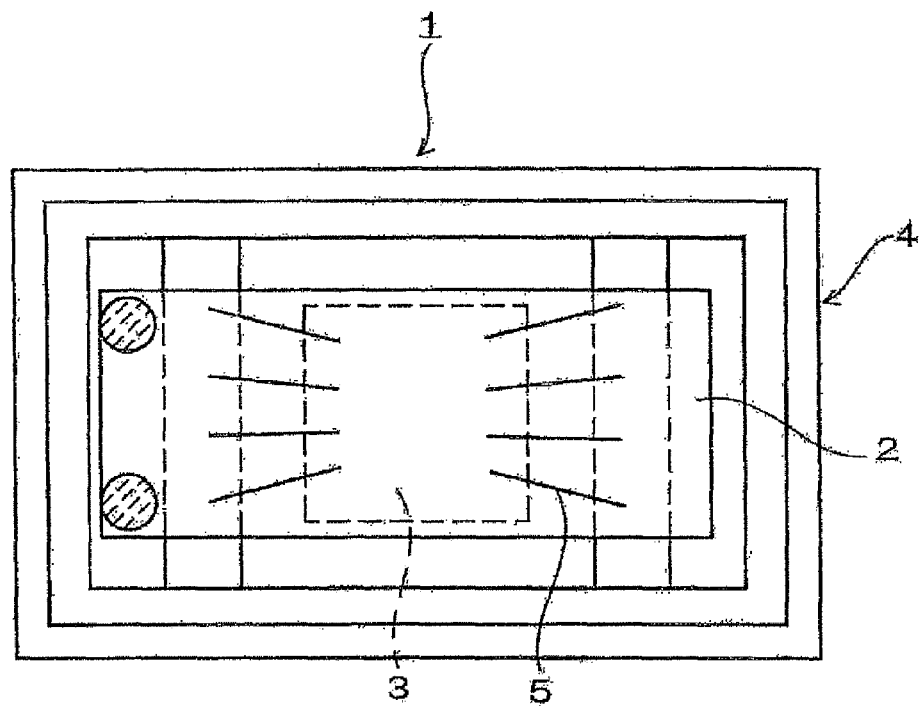
FIGS. 3A and 3B are diagrams showing the structure of a related art piezoelectric device intended for a reduction of the size.
Figure 3B:
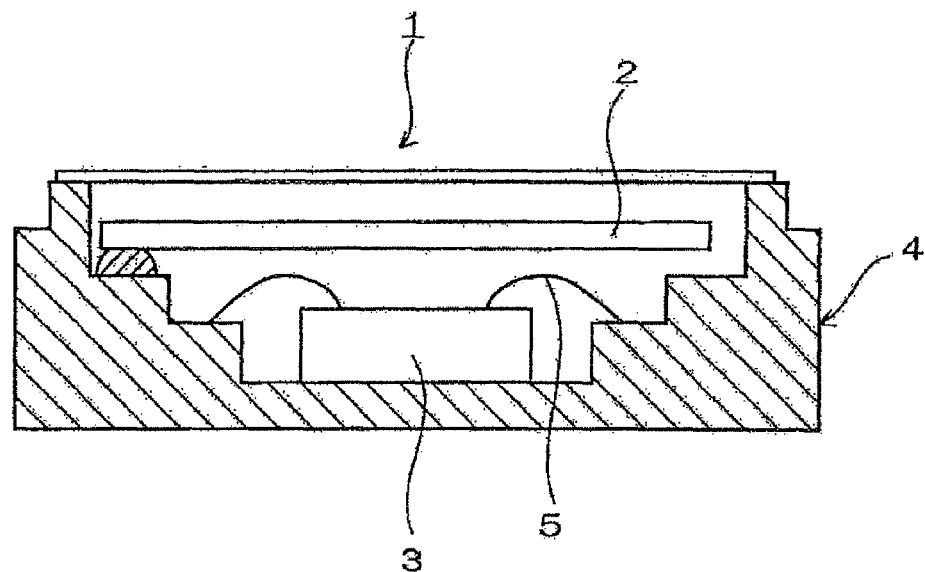
Figure 4A:
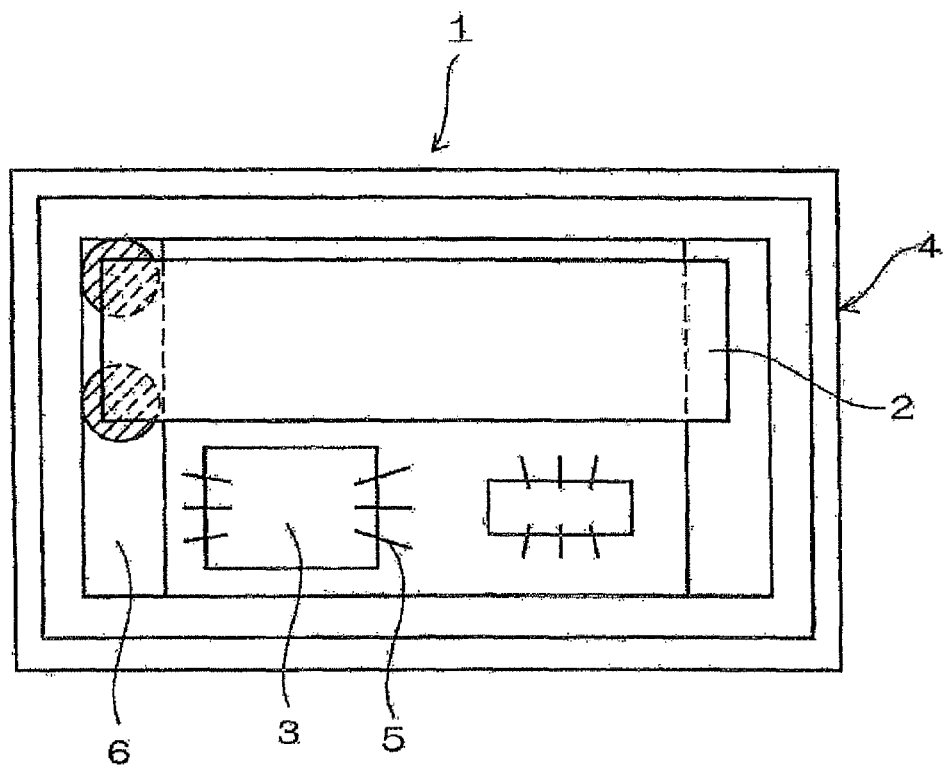
FIGS. 4A and 4B are diagrams showing the structure of a related art piezoelectric device intended for a reduction of the thickness.
Figure 4B:
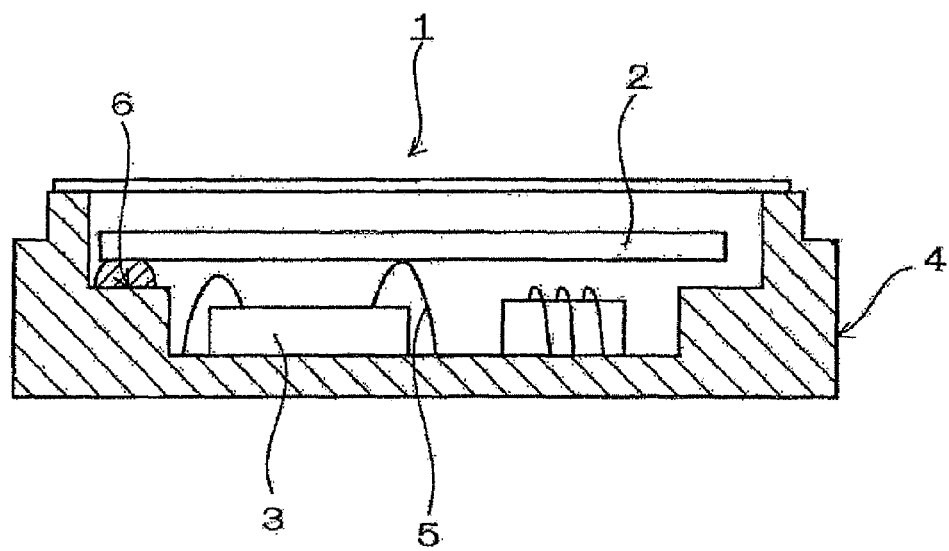

After the heating process is over, the IC 14 and the SAW element 12 are packaged on the base 16 through wire-bonding (See FIG. 2C).

After the above processes have been finished, the opening of the base 16 is sealed with a lid 17 to complete the SAW device.

In FIG. 1 and FIG. 2, the thin floor represents only the surface on which to mount the IC as an electronic component (including the clearance area for the collet as a jig), but it may also represent all except for the thick floor on which to mount the SAW element represents the thin floor.

What is claimed is:

1. A surface acoustic wave device, comprising:
   a package;
   a surface acoustic wave element mounted inside the package;
   an electronic component mounted inside the package;
   a bonding pad disposed on the electronic component; and
   a bonding wire that connects the electronic component and the package,
   wherein
   the package is provided with a base including a thick bottom portion and a thin bottom portion, the surface acoustic wave element is mounted on the thick bottom portion, and the electronic component is mounted on the thin bottom portion,
   when the base is seen in a plan view, at least part of the surface acoustic wave element overlaps the thin bottom portion, and
   the bonding wire that connects the electronic component to the package does not overlap the surface acoustic wave element in plan view.

2. The surface acoustic wave device as set forth in claim 1, wherein a height difference between the thin bottom portion and the thick bottom portion is greater than or equal to a thickness of the electronic component.

3. The surface acoustic wave device as set forth in claim 1, wherein when the base is seen in a plan view, a bonding pad formed on a surface of the base opposite to a surface on which the electronic component is mounted does not overlap the surface acoustic wave element.

4. The surface acoustic wave device as set forth in claim 3, wherein one end of a bonding wire is connected to the bonding pad.

* * * * *